United States Patent
Murakami et al.

(10) Patent No.: US 7,619,244 B2
(45) Date of Patent: Nov. 17, 2009

(54) ORGANIC LIGHT EMITTING DISPLAY APPARATUS

(75) Inventors: Hajime Murakami, Tokyo (JP); Masao Shimizu, Hitachi (JP); Sukekazu Aratani, Hitachiota (JP); Masahiro Tanaka, Chiba (JP)

(73) Assignee: Hitachi Displays, Ltd., Chiba (JP)

( * ) Notice: Subject to any disclaimer, the term of this patent is extended or adjusted under 35 U.S.C. 154(b) by 299 days.

(21) Appl. No.: 11/435,881

(22) Filed: May 18, 2006

(65) Prior Publication Data

US 2006/0261333 A1 Nov. 23, 2006

(30) Foreign Application Priority Data

May 20, 2005 (JP) .............................. 2005-147502

(51) Int. Cl.
*H01L 35/24* (2006.01)
*H01L 51/00* (2006.01)

(52) U.S. Cl. ................. 257/40; 257/E51.018
(58) Field of Classification Search ............ 257/40, 257/79, E51.018
See application file for complete search history.

(56) References Cited

U.S. PATENT DOCUMENTS

| | | | | |
|---|---|---|---|---|
| 5,416,494 A | * | 5/1995 | Yokota et al. | 345/79 |
| 5,714,838 A | * | 2/1998 | Haight et al. | 313/506 |
| 5,739,545 A | * | 4/1998 | Guha et al. | 257/40 |
| 5,969,474 A | * | 10/1999 | Arai | 313/504 |
| 6,172,459 B1 | * | 1/2001 | Hung et al. | 313/506 |
| 6,548,956 B2 | * | 4/2003 | Forrest et al. | 313/506 |
| 7,071,615 B2 | * | 7/2006 | Lu et al. | 313/506 |
| 7,157,852 B2 | * | 1/2007 | Lee | 313/506 |
| 7,321,196 B2 | * | 1/2008 | Cheng et al. | 313/504 |

FOREIGN PATENT DOCUMENTS

JP 2000-058265 2/2000

* cited by examiner

*Primary Examiner*—Jerome Jackson, Jr.
*Assistant Examiner*—Anthony Ho
(74) *Attorney, Agent, or Firm*—Antonelli, Terry, Stout & Kraus, LLP.

(57) ABSTRACT

The present invention provides a top emission type organic light emitting display apparatus in which manufacture it is possible to prevent the organic film from being oxidized when the upper transparent electrode is formed, and which is capable of emitting light at a low voltage. This organic light emitting display apparatus includes an organic light emitting layer and an upper electrode and a lower electrode sandwiching the said organic light emitting layer between them, and is of a structure in which the light emitted from the organic light emitting layer is taken out from the upper electrode side, wherein a buffer layer mostly made of an oxide with its Gibbs free energy generated at around the melting point being lower than −300 kJ/mol is provided between the organic light emitting layer and the upper electrode, the side of the organic layer which is in contact with the buffer layer being doped with an electron donative dopant.

6 Claims, 4 Drawing Sheets

| MATERIAL | NO BUFFER LAYER | ZnO | SnO2 | WO3 | MoO3 | V2O5 |
|---|---|---|---|---|---|---|
| MELTING POINT (K) | | 2243 | 1903 | 1745 | 1074 | 943 |
| GIBBS FREE ENERGY GENERATED AT AROUND MELTING POINT (kJ/mol) | | −123 | −192 | −382 | −468 | −1136 |
| RISE OF VOLTAGE RELATIVE TO BOTTOM EMISSION TYPE STRUCTURE AT 100 cd/m² LIGHT EMISSION (V) | RISE OF VOLTAGE TOOK PLACE | RISE OF VOLTAGE OCCURRED TO SOME EXTENT | RISE OF VOLTAGE OCCURRED TO SOME EXTENT | SLIGHTLY OCCURRED | SLIGHTLY OCCURRED | SLIGHTLY OCCURRED |

| MATERIAL | NO BUFFER LAYER | ZnO | SnO2 | WO3 | MoO3 | V2O5 |
|---|---|---|---|---|---|---|
| MELTING POINT (K) | | 2243 | 1903 | 1745 | 1074 | 943 |
| GIBBS FREE ENERGY GENERATED AT AROUND MELTING POINT (kJ/mol) | | -123 | -192 | -382 | -468 | -1136 |
| RISE OF VOLTAGE RELATIVE TO BOTTOM EMISSION TYPE STRUCTURE AT 100 cd/m² LIGHT EMISSION (V) | RISE OF VOLTAGE TOOK PLACE | RISE OF VOLTAGE OCCURRED TO SOME EXTENT | RISE OF VOLTAGE OCCURRED TO SOME EXTENT | SLIGHTLY OCCURRED | SLIGHTLY OCCURRED | SLIGHTLY OCCURRED |

FIG.4

| FILM THICKNESS (nm) | NO BUFFER LAYER | 1 | 5 | 25 | 50 | 75 |
|---|---|---|---|---|---|---|
| CURRENT EFFICIENCY RATIO | 1 | 1.0 | 1.0 | 0.9 | 0.9 | 0.4 |
| CHANGE OF VOLTAGE (V) | CHANGE OF VOLTAGE TOOK PLACE | CHANGE OF VOLTAGE OCCURRED TO SOME EXTENT | SLIGHTLY OCCURRED | SLIGHTLY OCCURRED | SLIGHTLY OCCURRED | SLIGHTLY OCCURRED |

ORGANIC LIGHT EMITTING DISPLAY APPARATUS

BACKGROUND OF THE INVENTION

The present invention relates to an organic light emitting display apparatus.

Recently, attention has been focused on the organic light emitting display apparatus as the next generation flat panel displays. Such organic light emitting display apparatus have outstanding advantageous properties such as spontaneous light emission, wide visual field and angle, and high response speed.

The conventional organic light emitting elements are of a structure comprising, laminated on a glass substrate, a first electrode made of ITO or the like, an organic layer comprising a hole transport layer, a light emitting layer and an electron transport layer, and an upper electrode of a low work function. The emitted light passes through the first electrode which is transparent, and is taken out from the back side (substrate side) of the structure.

However, in the organic light emitting display apparatus of the structure in which the emitted light is taken out from the back side (substrate side), in case of using an active matrix which has the advantages of higher definition and larger display size over a simple matrix, the aperture ratio is subject to limitation. Particularly in the large-size displays, in order to lessen variation of luminance between the pixels due to voltage drop of the power line, it is necessary to widen the power line, which leads to a substantial reduction of aperture ratio.

To overcome these problems, attempts have been made to make the upper electrode transparent and emit the light from the transparent upper electrode side.

For making the upper electrode transparent, its film is formed from an oxide mostly composed of indium oxide, such as ITO or IZO, by sputtering.

JP-A-2000-58265 (Patent Document 1) discloses such a top emission type organic light emitting element in which an organic cathode buffer layer is provided on an organic light emitting structure as a protective layer against damage during high-energy cathode deposition.

In the top emission type organic light emitting element, the layer interposed between the upper electrode and the organic layer needs to be reduced in thickness because of the problem of low transmittance or low conductivity, and it is impossible to prevent the organic layer from being oxidized when the upper electrode is formed, giving rise to the problem of elevated light emission voltage.

According to Patent Document 1 mentioned above, although it is possible to protect the organic buffer layer from being damaged during high energy deposition, the buffer layer itself is oxidized when the upper electrode is formed, and the rise of light emission voltage is unavoidable.

An object of the present invention is to provide a top emission type organic light emitting display apparatus in which manufacture it is possible to prevent the organic layer from being oxidized in the step of forming the upper transparent electrode and which is capable of emitting light at a low voltage.

SUMMARY OF THE INVENTION

In the present invention, in order to attain the above object, for instance the following means are incorporated.

An embodiment of the present invention is an organic light emitting display apparatus comprising an organic light emitting layer, and an upper electrode and a lower electrode between which the organic light emitting layer is sandwiched, wherein the light emitted from the said organic light emitting layer is taken out from the upper electrode side, and a buffer layer principally made of an oxide producing less oxygen by decomposition in the layer forming process than the upper electrode material is formed between the organic light emitting layer and the upper electrode. A side of the organic layer which is in contact with the buffer layer or the lower electrode is doped with an electron donative or hole donative dopant.

An organic light emitting element consists of an electron injection layer, an electron transport layer, an organic light emitting layer, an organic hole transport layer, a hole injection layer, an upper electrode and a lower electrode.

Other objects, features and advantages of the invention will become apparent from the following description of the embodiments of the invention taken in conjunction with the accompanying drawings.

DESCRIPTION OF REFERENCE NUMERALS

101: first transistor, 102: second transistor, 103: active layer, 104: capacity, 105: lower capacitor electrode, 106: scanning line, 107: gate electrode, 108: upper capacitor electrode, 109: signal line, 110: power line, 111: second power feed line, 112, 112': source electrode, 113: drain electrode, 114: power feed point, 115: lower electrode, 116: substrate, 117: gate insulating layer, 118: first insulating interlayer, 119: second insulating interlayer, 120: third insulating interlayer, 121: hole transport layer, 122: light emitting layer, 123: electron transport layer, 124: electron injection layer, 125: upper electrode, 126: protective layer, 127: buffer layer, 128: auxiliary electrode, 129: hole injection layer, 136: flattening layer, 200: reflector.

DETAILED DESCRIPTION OF THE INVENTION

For the hole injection layer in the present invention, materials having suitable ionization potentials are preferably used to reduce the injection barrier between the anode and the hole transport layer. Examples of such materials include, but are not limited to, copper phthalocyanines, star-burst amine compounds, polyanilines, and polythiophenes. The hole injection layer is preferably doped with a hole donative dopant. Preferred examples of such dopants are 2,3,5,6-tetrafluoro-tetracyanoquinodimethane (F4-TCNQ), iron chloride and dicyanodichloroquinone. Of course, the materials usable as dopant are not limited to those mentioned above. Also, two or more of these materials may be used in combination.

The hole transport layer in the present invention functions to transport holes and inject them into the light emitting layer. This hole transport layer, therefore, is preferably made of a material selected from those having high hole mobility, chemically stable and also high in glass transition temperature. Preferred examples of such materials include, but are not limited to, N,N'-bis(3-methylphenyl)-N,N'-diphenyl-[1,1'-biphenyl]-4,4'-diamine (TPD), 4,4'-bis[N-(1-naphthyl)-N-phenylamino]biphenyl (α-NPD), 4,4',4"-tri(N-carbazolyl) triphenylamine (TCTA), and 1,3,5-tris[N-(4-diphenylaminophenyl)phenylamino]benzene (p-DPA-TDAB). Two or more of these materials may be used simultaneously.

The light emitting layer in the present invention is a layer where the injected holes and electrons recombine and which emits light at a wavelength intrinsic to the material of the layer. There are two cases of light emission. In one case, the host material composing the light emitting layer emits light. In another case, the dopant material added in a small quantity to the host emits light. As the heterothallic host materials, the following materials are preferably used: distylylarylene derivatives (DPVBi), silole derivatives with benzene skeleton (2PSP), oxodiazole derivatives having a triphenylamine structure on both ends (EM2), perinone derivatives having phenanthrene groups (P1), oligothiophene derivatives having a triphenylamine structure on both ends (MBA-3T), perylene derivatives (tBu-PTC), tris(8-quinolinol) aluminum, poly-paraphenylene-vinylene derivatives, polythiophene derivatives, poly-paraphenylene derivatives, polysilane derivatives, and polyacetylene derivatives. The materials usable for this purpose are not limited to those listed above, and two or more of them can be used simultaneously.

As the dopant material, quinacridone, coumarin 6, Nile red, rubrene, 4-(dicyanomethylene)-2-methyl-6-(para-dimethylaminostyryl)-4H-pyran (DCM), and dicarbazole derivatives are preferably used. Of course the materials usable as dopant in this invention are not limited to those mentioned above, and two or more of these materials can be used simultaneously.

The electron transport layer in the present invention functions to transport electrons and inject them into the light emitting layer. Therefore, it preferably has a high electron mobility. Favorable materials of this layer are tris(8-quinolinol) aluminum, oxadiazole derivatives, silole derivatives, and zinc-benzothiazole complexes. Of course the usable materials are not limited to those mentioned above, and two or more of these materials can be used simultaneously.

The electron injection layer in the present invention is made of an organic compound doped with an electron donative dopant and intended to enhance the efficiency of electron injection from the cathode to the electron transport layer. The preferred examples of the electron donative dopants usable here include lithium, magnesium, calcium, strontium, barium, magnesium, aluminum, alkaline metal compounds, alkaline earth metal compounds, rare earth metal compounds, organic metal complexes containing alkaline metal ions, organic metal complexes containing alkaline earth metal ions, and organic metal complexes containing rare earth metal ions. Of course the materials usable as dopant are not limited to those mentioned above, and two or more of them can be used simultaneously. As the host material for the electron injection layer, it is preferable to use tris(8-quinolynol) aluminum, oxadiazole derivatives, silole derivatives and zinc-benzothiazole complex. Of course the materials usable as the host material are not limited to those mentioned above, and two or more of them can be used simultaneously.

In the above-described structure, it is possible to dispense with the electron injection layer or the hole injection layer. The structure without the electron transport layer or the hole transport layer is also conceivable.

The "upper electrode" and the "lower electrode" refer to a pair of electrodes disposed sandwiching the organic light emitting layer between them, of which the one positioned between the organic light emitting layer and the substrate is designated lower electrode and the one disposed on the side opposite from the substrate is designated upper electrode.

The organic light emitting element may take roughly the following two structures.

In one structure, the lower electrode functions as an anode and the upper electrode as a cathode. In this structure, a lower electrode, a hole injection layer, a hole transport layer, a light emitting layer, an electron transport layer, an electron injection layer and an upper electrode are laminated in that order. The electron injection layer or the hole injection layer may be eliminated. It is also possible to exclude the electron transport layer or the hole transport layer.

Thus, the buffer layer may take the following three ways of arrangement: it is contacted with the organic light emitting layer; it is contacted with the electron transport layer; or it is contacted with the electron injection layer.

The anode used as the lower electrode is preferably composed of a conductive film with a large work function for enhancing the hole injection efficiency. The materials usable for the anode include, but are not limited to, metals such as molybdenum, nickel and chromium, alloys of these metals, and inorganic materials such as polysilicon, amorphous silicon, tin oxides, indium oxide and indium-tin oxides (ITO).

The $In_2O_3$—$SnO_2$ films assume a poly-crystalline state when they are deposited by sputtering with the substrate temperature elevated to about 200° C. Since the poly-crystalline state causes a difference between the etching rate in the grains and that at the grain boundaries, the film is preferably of an amorphous state when it is used as the lower electrode.

In another structure, the lower electrode functions as a cathode and the upper electrode as an anode. This structure comprises a laminate of a lower electrode, an electron injection layer, an electron transport layer, a light emitting layer, a hole transport layer, a hole injection layer and an upper electrode in that order. The above structure may be devoid of the electron injection layer or the hole injection layer. Also, it may not have the electron transport layer or the hole transport layer.

Thus, in this case, too, there are the following three ways of arrangement for the buffer layer: it is contacted with the organic light emitting layer; it is contacted with the hole transport layer; or it is contacted with the hole injection layer.

As the cathode used as the lower electrode, a conductive film with a low work function is preferably used for enhancing the electron injection efficiency. Materials such as aluminum, aluminum-neodymium alloy, magnesium-silver alloy, aluminum-lithium alloy, aluminum-calcium alloy, aluminum-magnesium alloy, metallic calcium and cerium compounds can be used for the cathode, but the materials usable therefor are not limited to those mentioned above.

The oxides having indium oxide as base can be mentioned as the materials usable for the upper electrode. The $In_2O_3$—$SnO_2$ and $In_2O_3$—ZnO transparent conductive films are especially preferred. Various methods such as sputtering, facing target sputtering, EB evaporation and ion-plating are available for making these transparent conductive films.

In the upper electrode film forming operation, the oxide used as the upper electrode material is partially decomposed and the generated oxygen radicals act to oxidize the organic layer to elevate the light emission voltage. As a result of close investigations, it was found that it is possible to curb the rise of light emission voltage caused by oxidation of the organic layer in the upper electrode forming operation by providing between the organic layer and the upper electrode a buffer layer mostly composed of a conductive oxide having a stronger oxygen bonding force than the upper electrode.

As the buffer layer mostly composed of a conductive oxide having a stronger oxygen bonding force than the upper electrode, in case of using an upper electrode mostly composed of, for instance, indium oxide, there can be used the materials mostly composed of vanadium oxide, molybdenum oxide, tungsten oxide, tantalum oxide, titanium oxide, niobium oxide, chromium oxide or the like. On the other hand, the materials mostly composed of germanium oxide, copper oxide, ruthenium oxide or the like are weaker in oxygen bonding force than indium oxide, so that there are produced a greater amount of oxygen radicals at the time of formation of the buffer layer than at the time of formation of the upper electrode film, making it impossible to hold down the rise of light emission voltage.

Another embodiment of the present invention is an organic light emitting display apparatus comprising an organic light emitting layer, and an upper electrode and a lower electrode between which the said organic light emitting layer is sandwiched, wherein the light emitted from the said organic light emitting layer is taken out from the upper electrode side, and a buffer layer mostly composed of an oxide with its Gibbs free energy generated at around the melting point being lower than that of the upper electrode material is disposed between the said organic light emitting layer and the said upper electrode.

By using for the buffer layer a material which is lower in Gibbs free energy generated at around the melting point than the base material of the upper electrode, it is possible to lessen the amount of oxygen radicals produced by decomposition before and in the initial phase of film forming, and to thereby suppress oxidation of the organic layer.

Still another embodiment of the present invention provides an organic light emitting display apparatus comprising an organic light emitting layer and an upper electrode and a lower electrode sandwiching the said organic light emitting layer between them, wherein the light emitted from the said organic light emitting layer is taken out from the upper electrode side, and a buffer layer mostly composed of an oxide with its Gibbs free energy generated at around the melting point being lower than −300 kJ/mol is provided between the said organic light emitting layer and the said upper electrode.

By using for the buffer layer a material with its around-melting-point Gibbs free energy being lower than −300 kJ/mol, it is possible to hold the rise of voltage below 1 V.

In yet another embodiment of the present invention, there is provided an active matrix type organic light emitting display apparatus comprising a plurality of pixels and thin film transistors driving these pixels, each of said pixels having an organic light emitting element comprising an organic light emitting layer and an upper electrode and a lower electrode between which the organic light emitting layer is sandwiched, wherein the light emitted from the said organic light emitting layer is taken out from the upper electrode side, said upper electrode being connected to an auxiliary electrode, and a buffer layer mostly composed of an oxide with its around-melting-point Gibbs free energy being lower than −300 kJ/mol is provided between the said organic light emitting layer and the said upper electrode and between the said upper electrode and the said auxiliary electrode.

Each circuit for active driving of the pixels usually consists of 2 to 4 pieces of thin film transistor (TFT) and a capacitor, but the number of TFTs is not limited to 2 to 4; it is possible to provide more than 4 pieces of TFT in each circuit.

The term "pixel" used here signifies the minimum unit for displaying characters or graphics on a screen of a display apparatus on which a plurality of such unit pixels are arranged vertically and horizontally.

In the case of a full-color display, usually each pixel consists of sub-pixels of three colors: green, red and blue.

Low-resistance materials such as aluminum, copper and their alloys are used for the auxiliary electrode, but the materials usable therefor are not limited to the above-mentioned.

In still another embodiment of the present invention, the upper electrode is a transparent electrode mostly composed of indium oxide.

Combination of the transparent electrode mostly composed of highly conductive indium oxide and the said buffer layer enables emission of light at a low voltage.

In yet another embodiment of the present invention, the buffer layer is made of a material mostly composed of an oxide having a specific resistance below $1 \times 10^7$ Ω·cm and the buffer layer has a thickness of 5 to 50 nm.

In case of using a material with a specific resistance of $1 \times 10^7$ Ω·cm or above for the buffer layer, there takes place 0.1 V or greater voltage drop in the buffer layer at the time of high luminance emission, which offsets the oxidation preventing effect. It is possible to inhibit oxidation of the organic layer by making the layer thickness 5 nm or greater, but if the layer thickness is made 50 nm or greater, the reduction of efficiency due to the drop of transmittance becomes unnegligible. The above structure is based on these facts.

In yet another embodiment of the present invention, the upper electrode is an anode, and the said buffer layer is mostly composed of an oxide of vanadium. By having the upper electrode serve as an anode and using an oxide of vanadium as the main constituent of the buffer layer, it is possible to substantially zero the rise of voltage. The composition of the oxide of vanadium is preferably the one in which the ratio of oxygen to vanadium is 2-5.

Provided as still another embodiment of the present invention is an active matrix type organic light emitting display apparatus comprising a plurality of pixels and thin film transistors driving these pixels, each of said pixels having an organic light emitting element which comprises an electron injection layer, an electron transport layer, an organic light emitting layer, an organic hole transport layer, an upper electrode and a lower electrode, wherein the light emitted from the said organic light emitting layer is taken out from the upper electrode side, and a buffer layer mostly composed of an oxide of vanadium is provided between the said organic hole transport layer and the said upper electrode.

By adapting the upper electrode to serve as an anode and using vanadium oxide for the buffer layer, since vanadium oxide is also capable of functioning as a hole transport layer, it is enabled to supply holes directly to the light emitting layer without the organic hole transport layer and the organic hole injection layer.

In the present invention, a protective layer may be formed on the upper electrode to prevent $H_2O$ and $O_2$ in the atmosphere from penetrating into the upper electrode or the underlying organic layer. The materials usable for the protective layer include, but are not limited to, the inorganic materials such as $SiO_2$, $SiN_X$, $SiO_XN_Y$ and $Al_2O_3$, and the organic materials such as polypropylene, polyethylene terephthalate, polyoxymethylene, polyvinyl chloride, polyvinylidene fluoride, cyanoethyl pullulan, polymethyl methacrylate, polysulfone, polycarbonate and polyimide.

With these display apparatus, it is possible to lessen oxidation of the organic layer in the upper electrode forming operation and to curb the rise of light emission voltage which has been seen in the display apparatus of the conventional structures.

DESCRIPTION OF PREFERRED EMBODIMENTS

Examples of the present invention are illustrated below.

Example 1

Figure 1:
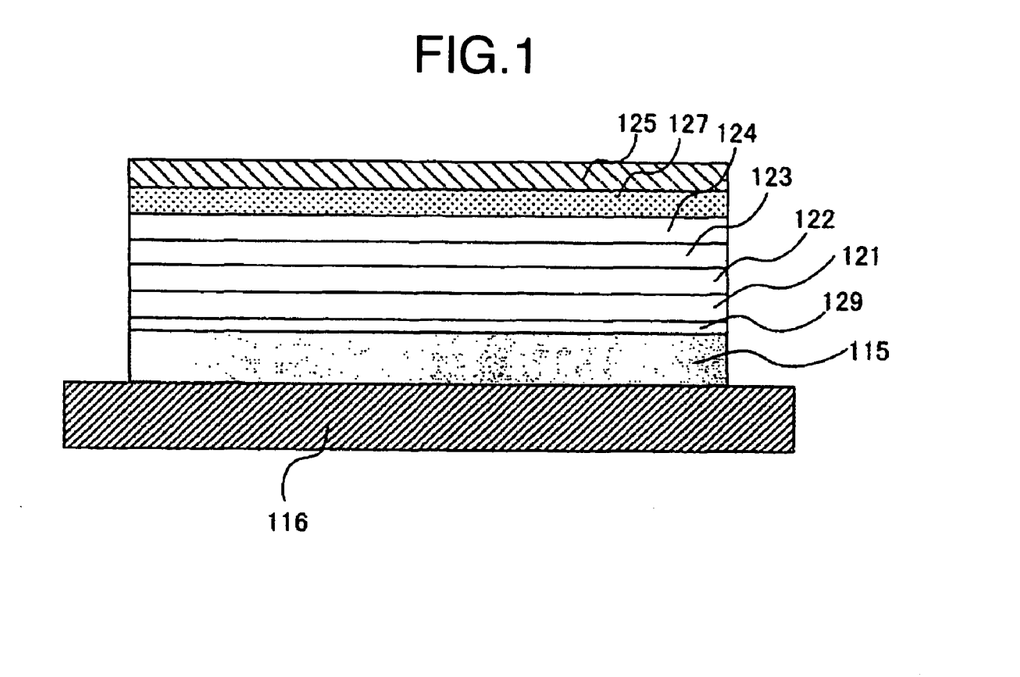
FIG. 1 is a cross-sectional view of a pixel region in an organic light emitting apparatus according to Example 1 of the present invention.

An example of organic light emitting display apparatus according to the present invention is explained below. FIG. 1 is a cross-sectional view of the organic light emitting display apparatus according to Example 1 of the present invention. The lower electrode 115 comprises an Cr film formed by EB deposition. The electrode film was patterned by using a shadow mask, and its thickness was 100 nm.

Then a 50 nm thick co-deposition film of F4-TCNQ and copper phthalocyanine was formed by two-source simultaneous vacuum deposition using a shadow mask for patterning. The F4-TCNQ:copper phthalocyanine molar ratio was 1:1. This co-deposition film functions as a hole injection layer 129.

Then a film of 4,4-bis[N-(1-naphthyl)-N-phenylamino]biphenyl (hereinafter abbreviated as α-NPD) with a thickness of 50 nm was formed by vacuum deposition using a shadow mask for patterning. The deposition region was 1.2 times each edge of the lower electrode. This α-NPD film works as a hole transport layer 121.

On the hole transport layer 121, a 20 nm thick co-deposition film of tris(8-quinolinol) aluminum (hereinafter abbreviated as Alq) and quinacridone (hereinafter abbreviated as Qc) was formed by two-source simultaneous vacuum deposition with the deposition rate controlled at 40:1. This co-deposition film of Alq and Qc serves as a light emitting layer 122. Its pattern was formed using a shadow mask.

On this Alq/Qc co-deposition film was formed an Alq film, 10 nm thick, by vacuum deposition. This Alq film functions as an electron transport layer 123. During the formation of the electron transport layer 123, a shadow mask was used to form its pattern.

Then an Li-doped Alq film, 10 nm thick, was formed as an electron injection layer 124 by two-source simultaneous vacuum deposition using a shadow mask for patterning. The Alq:Li molar ratio was 1:1.

A buffer layer 127 was formed by EB deposition with a material selected from ZnO, $SnO_2$, $WO_3$, $MoO_3$ and $V_2O_5$ using a shadow mask for its patterning. The buffer layer thickness was 15 nm in all the cases.

A 100 nm thick film of In—Zn—O (hereinafter abbreviated as IZO film) was formed by sputtering to serve as an upper electrode 125. This film is an amorphous oxide film. A target with a composition of In/(In+Zn)=0.83 was used for sputtering which was carried out in an $Ar/O_2$ mixed gas atmosphere under a vacuum pressure of 1 Pa at a sputtering output of 0.2 $W/cm^2$. The upper electrode 125 comprising this In—ZnO film serves as an anode with a transmittance of 80%.

Figure 2:
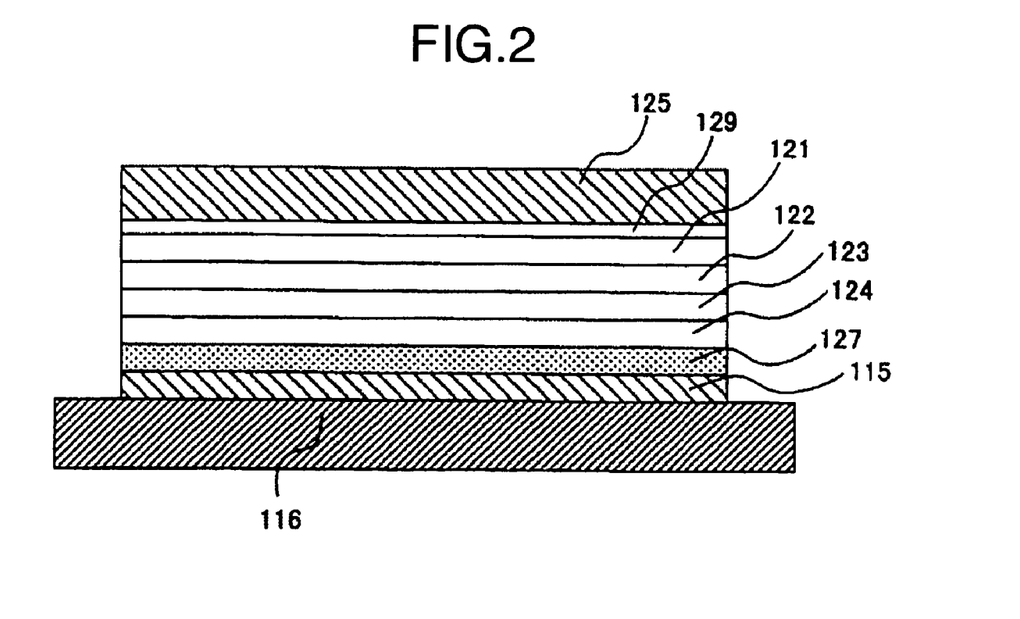
FIG. 2 is a cross-sectional view of a bottom emission type organic light emitting apparatus made for the comparison with Example 1 of the present invention.

FIG. 2 illustrates a bottom emission type display apparatus which was made to ensure the effect of the buffer layer. An IZO film, 100 nm thick, was formed by sputtering. This IZO film functions as a lower electrode 115 and is an amorphous oxide film. The same film forming conditions as employed in the example shown in FIG. 1 were used. On the lower electrode, a buffer layer 127, an electron injection layer 124, an electron transfer layer 123, a light emitting layer 122, a hole transport layer 121 and a hole injection layer 129 were laminated in this order. The materials of the respective layers, film forming conditions and film thickness were the same as in the example shown in FIG. 1. The upper electrode 125 is an Cr film formed by EB deposition using a shadow mask for its patterning. The film thickness was 100 nm. In this bottom emission type display device, since the upper electrode is a metallic electrode, there occurs no rise of light emission voltage due to oxidation of the organic layer during formation of the upper electrode.

Figure 3:
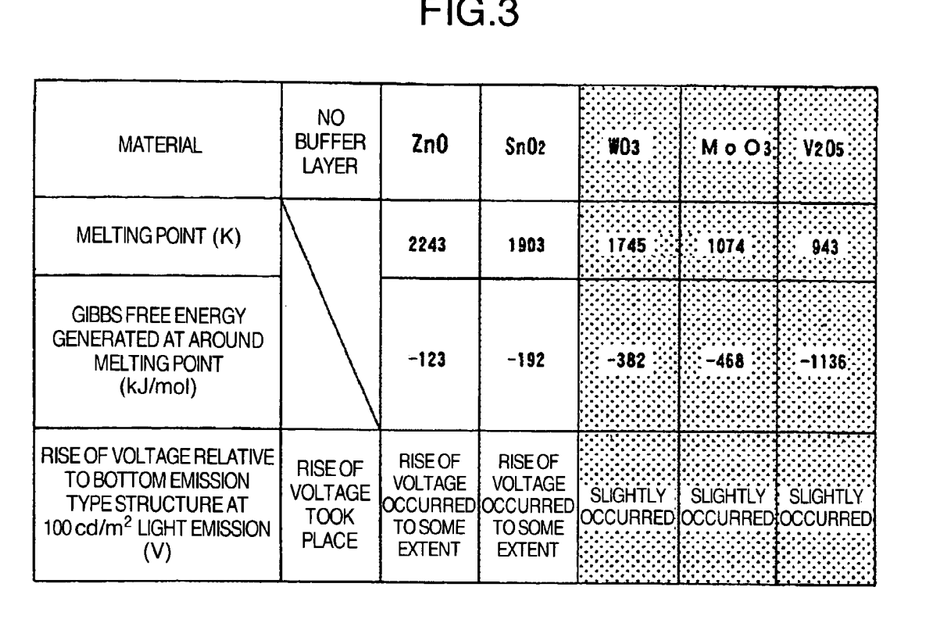
FIG. 3 is a table showing the rise of voltage, relative to the bottom emission type organic light emitting apparatus, at 100 cd/m$^2$ light emission in the organic light emitting apparatus fabricated in Example 1 of the present invention.

FIG. 3 shows the change of voltage with the respective buffer layer materials at 100 $cd/m^2$ light emission. The change of voltage is the difference from the bottom emission type display apparatus made by using a same buffer layer material. In case a material having a stronger oxygen bonding force than indium oxides, with its Gibbs free energy generated at around the melting point being lower than −300 kJ/mol, is used for the buffer layer, the rise of voltage is slight in comparison to the bottom emission type. In contrast, in case of using a material having a weaker bonding force with oxygen than indium oxides, with its Gibbs free energy generated at around the melting point being higher than −300 kJ/mol, there was observed a slight rise of voltage in the top emission type as compared with the bottom emission type due to oxidation of the organic layer.

Example 2

Another example of organic light emitting display apparatus of the present invention is explained below.

An organic light emitting display apparatus same as Example 1 in structure but different in thickness of the buffer layer was fabricated.

A film of vanadium oxide was formed as buffer layer 127 by EB deposition using a shadow mask for patterning. The film thickness was 1, 5, 25, 50 and 75 nm. A similar display apparatus having no buffer layer was also made by way of comparison. The vanadium oxide film had a composition of V:O=1:2.45.

Figure 4:
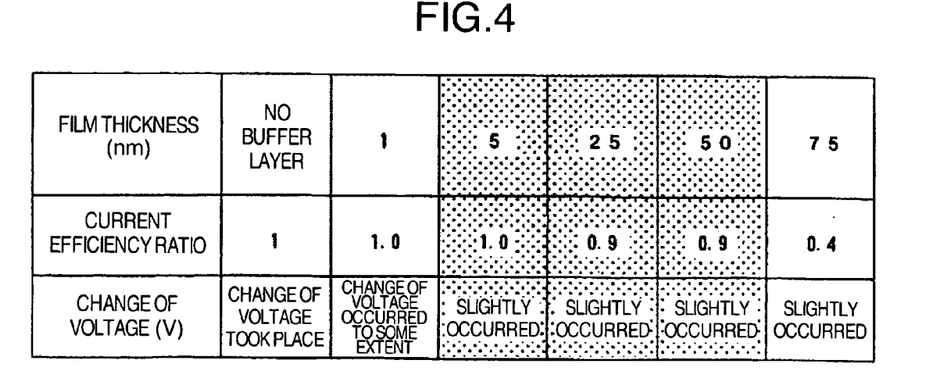
FIG. 4 is a table showing the change of voltage relative to the apparatus having no buffer layer, at 100 cd/m$^2$ light emission in the organic light emitting apparatus fabricated in Example 2 of the present invention.

FIG. 4 shows the change of voltage and current efficiency ratio according to the buffer layer thickness at 100 $cd/m^2$ light emission. The change of voltage shown here is the one relative to the bottom emission type display apparatus shown in FIG. 2. Current efficiency ratio is the ratio to the current efficiency of the bottom emission type display apparatus which is supposed to be 1. If the buffer layer thickness is less than 5 nm, oxidation of the organic layer can not be prevented, so the rise of light emission voltage can not be curbed. Also, a buffer layer thickness of greater than 50 nm leads to a reduction of transmittance, resulting in a lowered current efficiency. The definition of the buffer layer thickness in the range of 5 to 50 nm according to the present invention makes it possible to hold down the rise of voltage without lowering the current efficiency.

Example 3

Figure 5:
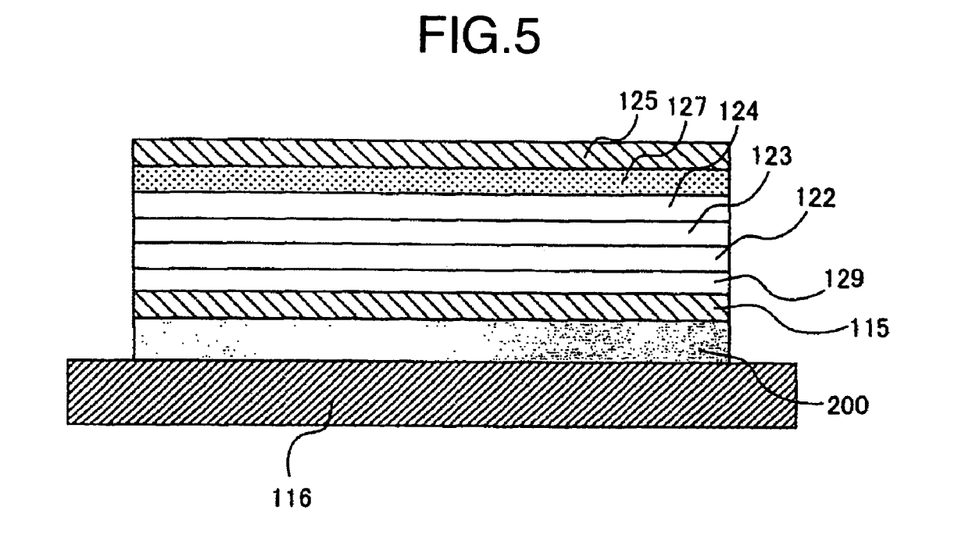
FIG. 5 is a cross-sectional view of a pixel region in the organic light emitting apparatus according to Example 3 of the present invention.

Still another example of the organic light emitting display apparatus according to the present invention will be explained. FIG. 5 is a cross-sectional view of the organic light emitting display apparatus in the instant example of the present invention.

A 150 nm thick Al—Si film was formed by sputtering as reflection electrode 200 and patterned by photolithography. Also, an ITO film, 90 nm thick, was formed by sputtering as lower electrode 115 and patterned by photolithography.

Then polyethylenedioxythiophene (PEDT) incorporated with polystyrenesulfonic acid (PSS) was spin coated thereon to form a film having a thickness of 40 nm after dried at 200° C. This PSS-incorporated PEDT film functions as a hole injection layer 129.

On this film was further spin coated polyfluorene to form a 40 nm thick film after dried at 80° C. This polyfluorene film serves as a light emitting layer 122.

On this polyfluorene film was formed an Alq film, 10 nm thick, by vacuum deposition using a shadow mask for patterning. This Alq film functions as an electron transport layer 123.

Then an Li-doped Alq film, 10 nm thick, was formed by two-source simultaneous vacuum deposition as electron injection layer 124 using a shadow mask for patterning. The Alq:Li molar ratio was 1:1.

A buffer layer 127 was formed with vanadium oxide by EB deposition using a shadow mask for patterning. The layer thickness was 15 nm.

An In—Zn—O film, 100 nm thick, was formed by sputtering to function as an upper electrode 125. This is an amorphous oxide film. A target with a composition of In/(In+Zn)=0.83 was used for sputtering which was carried out in an Ar/$O_2$ mixed gas atmosphere under a vacuum pressure of 1 Pa at a sputtering output of 0.2 W/cm$^2$. The upper electrode 125 comprising this IZO film serves as an anode with a transmittance of 80%.

With the organic light emitting display apparatus in the instant embodiment of the present invention, it is possible to curb the rise of light emission voltage.

Example 4

Figure 6:
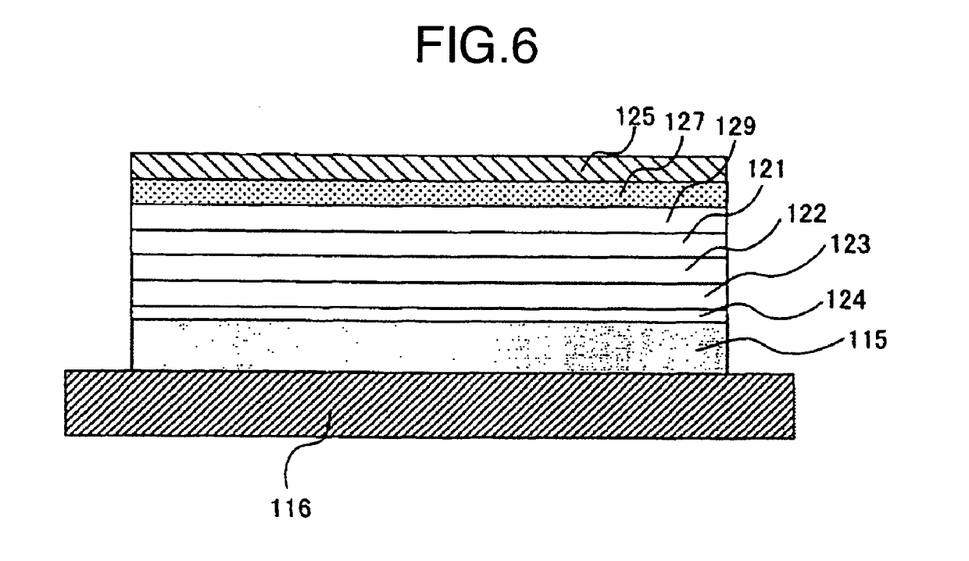
FIG. 6 is a cross-sectional view of a pixel region in the organic light emitting apparatus according to Example 4 of the present invention.

Still another example of organic light emitting display apparatus according to the present invention is explained with reference to FIG. 6 which is a cross-sectional view of the apparatus. The lower electrode 115 comprises an Al film formed by EB deposition. The electrode film was patterned by using a shadow mask, and its thickness was 100 nm.

Then an Li-doped Alq film, 10 nm thick, was formed as an electron injection layer 124 by two-source simultaneous vacuum deposition using a shadow mask for patterning. The Alq:Li molar ratio was 1:1.

On this film was formed a 10 nm thick Alq film by vacuum deposition using a shadow mask for patterning. This Alq film works as an electron transport layer 123.

On the electron transport layer 123, a 20 nm thick co-deposition film of tris(8-quinolinol) aluminum (Alq) and quinacridone (Qc) was formed by two-source simultaneous vacuum deposition with the deposition rate controlled at 40:1. This co-deposition film of Alq and Qc serves as a light emitting layer 122. Its pattern was formed using a shadow mask.

Then a film of 4,4-bis[N-(1-naphthyl)-N-phenylamino]biphenyl (α-NPD) with a thickness of 50 nm was formed by vacuum deposition using a shadow mask for patterning. The deposition region was 1.2 times each edge of the lower electrode. This α-NPD film works as a hole transport layer 121.

Then a 50 nm thick co-deposition film of F4-TCNQ and copper phthalocyanine was formed by two-source simultaneous vacuum deposition using a shadow mask for patterning. The F4-TCNQ:copper phthalocyanine molar ratio was 1:1. This co-deposition film functions as a hole injection layer 129.

A buffer layer 127 was formed with vanadium oxide by EB deposition using a shadow mask for patterning. The film thickness was 15 nm. The deposited vanadium oxide film had a composition of V:O=1:2.2, and its transmittance was 95%.

An In—Zn—O film (IZO film), 100 nm thick, was formed by sputtering to function as an upper electrode 125. This is an amorphous oxide film. A target with a composition of In/(In+Zn)=0.83 was used for sputtering which was carried out in an Ar/$O_2$ mixed gas atmosphere under a vacuum pressure of 1 Pa at a sputtering output of 0.2 W/cm$^2$. The upper electrode 125 comprising this IZO film serves as an anode with a transmittance of 80%.

With the organic light emitting display apparatus according to this embodiment, it is possible to lessen the rise of light emission voltage.

Example 5

Figure 7:
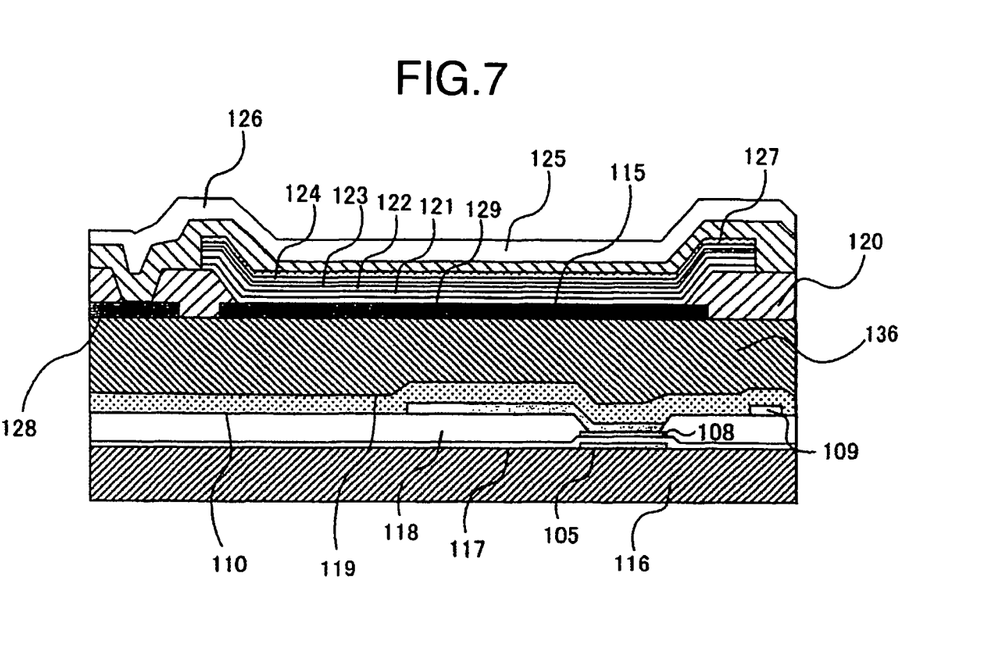
FIG. 7 is a cross-sectional view of a pixel region in the organic light emitting apparatus according to Example 5 of the present invention.

Still another example of organic light emitting display apparatus according to the present invention is explained with reference to FIG. 7 which shows a section of the apparatus.

The organic light emitting display apparatus of this example is an active matrix type organic light emitting display apparatus comprising a plurality of pixels and thin film transistors driving these pixels, each of said pixels having an organic light emitting element which comprises an organic light emitting layer and an upper electrode and a lower electrode sandwiching the said organic light emitting layer between them, wherein the light emitted from the organic light emitting layer is taken out from the upper electrode side, said upper electrode being connected to an auxiliary electrode made of a low-resistance material, said organic light emitting element having its constituent layers arranged in the order of lower electrode, organic light emitting layer and upper electrode, and a buffer layer mostly composed of an oxide with its Gibbs free energy generated at around the melting point being lower than −300 kJ/mol is provided between said organic light emitting layer and said upper electrode and between said upper electrode and said auxiliary electrode.

A method of manufacturing the organic light emitting display apparatus of the instant example is explained below.

A film of amorphous silicon (a-Si), 50 nm thick, was formed on a glass substrate 116 by low pressure CVD (LPCVD). Then the whole surface of the a-Si film was laser-annealed, whereby the a-Si was crystallized to form polycrystalline Si (p-Si). Then the p-Si film was patterned by dry etching to form an active layer 103 for the first transistor 101, an active layer 103' for the second transistor 102, and a lower capacitor electrode 105.

Then a 100 nm thick $SiO_2$ film was formed as a gate insulating film 117 by plasma enhanced CVD (PECVD).

Further, a TiW film having a thickness of 50 nm was formed as gate electrodes 107, 107' by sputtering and patterned. Patterning was also conducted on the scanning line 106 and the upper capacitor electrode 108.

Next, N ions were injected into the patterned p-Si layer from the top of the gate insulating film 117 by ion implantation. No N ions were injected to the region above which the gate electrode was present, thus forming the active layers 103 and 103'.

Then the glass substrate 116 was activated in an inert atmosphere of $N_2$ by heating so that the doping could be conducted effectively. On this substrate, a silicon nitride ($SiN_x$) film, 200 nm thick, was formed as a first insulating interlayer 118.

Then contact holes were formed in the gate insulating film 117 and the first insulating interlayer 118 on both ends of the active layers 103 and 103'. Contact holes were also formed in the first insulating interlayer 118 on the gate electrode 107' for the second transistor.

On the contact hole was formed a 500 nm thick Al film by sputtering, and a signal line 109 and a power line 110 were formed by a photolithographic process. There were also formed a source electrode 112 and a drain electrode 113 for the first transistor 101, and a source electrode 112' and a drain electrode 113' for the second transistor 102.

The lower capacitor electrode 105 and the drain electrode 113 of the first transistor 101 were connected. Also, the source electrode 112 of the first transistor 101 was connected to the signal line 109.

The drain electrode 113 of the first transistor was connected to the gate electrode 107' of the second transistor, and the drain electrode 113' of the second transistor was connected to the power line 110. Further, the upper capacitor electrode 108 was connected to the power line 110.

A second insulating interlayer 119 of $SiN_X$ with a thickness of 500 nm was formed, and a contact hole was formed on top of the source electrode 112' of the second transistor. On the contact hole was formed a 150 nm thick Cr film by sputtering, and a lower electrode 115 was formed by photolithograhy.

A positive type protective film of a light sensitive resin (PC452 produced by JSR Corp.) was formed as a third insulating interlayer 120 by spin coating and baked. The third insulating interlayer 120 of PC452 was 1 μm thick and covered the edge of the lower electrode 115 by 3 μm.

The structure of the organic light emitting element composing a pixel is explained with reference to FIG. 2. The glass substrate 116 having the lower electrode 115 formed thereon was subjected to ultrasonic cleaning with acetone and then with pure water, each for 3 minutes, and then spin dried.

Then a 50 nm thick co-deposition film of F4-TCNQ and copper phthalocyanine was formed by two-source simultaneous vacuum deposition. The F4-TCNQ:copper phthalocyanine molar ratio was 1:1. This co-deposition film serves as a hole injection layer 129. A shadow mask was used for its patterning.

Then a film of 4,4-bis[N-(1-naphthyl)-N-phenylamino]biphenyl (α-NPD), 50 nm thick, was formed by vacuum deposition using a shadow mask for forming its pattern. The deposition region was 1.2 times each edge of the lower electrode. This α-NPD film serves as a hole transport layer 121.

On the hole transport layer 121 was formed a 20 nm thick co-deposition film of tris(8-quinolinol) aluminum (Alq) and quinacridone (Qc) by two-source simultaneous vacuum deposition, with the deposition rate being controlled at 40:1. This co-deposition film of Alq and Qc functions as a light emitting layer 122. A shadow mask was used for patterning.

On this co-deposition film was formed a 10 nm thick Alq film by vacuum deposition. This Alq film serves as an electron transport layer 123. A shadow mask was used for forming the pattern.

An Li-doped Alq film, 10 nm thick, was formed by two-source simultaneous vacuum deposition to serve as an electron injection layer 124. The Alq:Li molar ratio was 1:1. A shadow mask was used for patterning.

Then a 15 nm thick vanadium oxide film was formed as a buffer layer 127 by EB deposition using a shadow mask for patterning. The vanadium oxide composition after deposition was vanadium:oxide=1:2.2, and the transmittance of the film was 95%.

Then a 100 nm thick film of In—Zn—O (IZO) was formed by sputtering. This IZO film serves as an upper electrode 125 and is amorphous. A target with a composition of In/(In +Zn)=0.83 was used. Sputtering was carried out in an Ar/$O_2$ mixed gas atmosphere under a vacuum pressure of 1 Pa at a sputtering output of 0.2 W/cm². The upper electrode 125 comprising the IZO film serves as an anode. Its transmittance was 80%.

Then a film of $SiO_XN_Y$, 50 nm thick, was formed by sputtering to serve as a protective layer 126.

The organic light emitting display apparatus of this example can lessen the rise of light emission voltage.

By using the present invention, it is possible to realize a high-efficiency spontaneously light emitting thin display apparatus. The invention also finds utilization for various types of display devices such as television and information terminals.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An organic light emitting display apparatus comprising; an organic light emitting layer sandwiched between an upper electrode and a lower electrode, and a buffer layer which is arranged between the organic light emitting layer and the upper electrode; wherein the light emitted from the organic light emitting layer is radiated out through the upper electrode, and the buffer layer which includes an oxide from a set of oxides consisting of WO, MoO and VO, the organic light emitting layer includes an electron donative dopant, and the organic light emitting layer is arranged in contact with the buffer layer.

2. The organic light emitting display apparatus according to claim 1 wherein the upper electrode is a transparent electrode comprising indium oxide.

3. The organic light emitting display apparatus according to claim 1 wherein the oxide in the buffer layer has a specific resistance of $1 \times 10^7$ Ω·cm or less and the buffer layer has a thickness of 5 to 50 nm.

4. The organic light emitting display apparatus according to claim 1 wherein the buffer layer which includes an oxide from a set of oxides consisting of $WO_3$, $MoO_3$ and $V_2O_5$ is arranged between the organic light emitting layer and the upper electrode so as to produce less oxygen by decomposition than a material forming the upper electrode, and displaced as a shield to inhibit oxidation of the organic light emitting layer during an electrode forming process.

5. An active matrix type organic light emitting display apparatus comprising; a plurality of pixels and a plurality of thin film transistors for driving the plurality of pixels; wherein each of the plurality of pixels includes an organic light emitting element having an organic light emitting layer sandwiched between an upper electrode and a lower electrode; wherein the light emitted from the organic light emitting layer is radiated out from the upper electrode the upper electrode is connected to an auxiliary electrode; a buffer layer which is arranged between the organic light emitting layer and the upper electrode and between the upper electrode and an auxiliary electrode includes an oxide from a set of oxides consisting of $WO_3$, $MoO_3$ and $V_2O_5$; the organic light emitting layer includes an electron donative dopant; and the organic light emitting layer is arranged in contact with the buffer.

6. The organic light emitting display apparatus according to claim 5 wherein the buffer layer which includes an oxide from a set of oxides consisting of $WO_3$, $MoO_3$ and $V_2O_5$ is arranged between the organic light emitting layer and the upper electrode so as to produce less oxygen by decomposition than either material forming the upper electrode or material forming the auxiliary electrode, and displaced as a shield to inhibit oxidation of the organic light emitting layer during an electrode forming process.

* * * * *